(12) United States Patent
Hung

(10) Patent No.: US 6,805,536 B2
(45) Date of Patent: Oct. 19, 2004

(54) HEAT DISSIPATION FAN

(75) Inventor: Tsung-Yung Hung, Taipei (TW)

(73) Assignees: Averatec Inc., Foothill Ranch, GA (US); Averatec Europe GmbH, Hallbergmoos (DE); Averatec Asia Incorporation (TW)

(*) Notice: Subject to any disclaimer, the term of this patent is extended or adjusted under 35 U.S.C. 154(b) by 95 days.

(21) Appl. No.: 10/353,179

(22) Filed: Jan. 28, 2003

(65) Prior Publication Data

US 2004/0146405 A1 Jul. 29, 2004

(51) Int. Cl.[7] .............................................. F01D 25/08
(52) U.S. Cl. ................................. 416/244 R; 415/206
(58) Field of Search ................................. 415/206, 224, 415/175; 416/244 R

(56) References Cited

U.S. PATENT DOCUMENTS

| | | | | |
|---|---|---|---|---|
| 2,936,947 A | * | 5/1960 | Staak | 417/353 |
| 3,385,510 A | * | 5/1968 | Hollander, Jr. | 417/354 |
| 4,686,400 A | * | 8/1987 | Fujisaki et al. | 310/67 R |
| 4,868,436 A | * | 9/1989 | Attilio et al. | 310/67 R |
| 5,862,037 A | * | 1/1999 | Behl | 361/687 |
| 5,982,064 A | * | 11/1999 | Umeda et al. | 310/90 |

* cited by examiner

Primary Examiner—Edward K. Look
Assistant Examiner—Igor Kershteyn
(74) Attorney, Agent, or Firm—Ostrolenk, Faber, Gerb & Soffen, LLP

(57) ABSTRACT

A heat dissipation fan having a side mount configuration includes a casing having a bottom wall and a surrounding side wall extending from the bottom wall to define an open top. The side wall also defines a side opening to guide an air flow toward a heat source. A cross bar is detachably mounted to the open top or is made of resilient material. A shaft is arranged inside the casing and has upper and lower ends removably received in a recess defined in the cross bar and a notch defined in the bottom wall of the casing. A blade assembly comprised of a cylinder and blades extending from the cylinder is rotatably mounted to the shaft. Windings and magnets are arranged inside the cylinder. Electrical wires are electrically connected to the windings via conductive pads formed on the upper end of the shaft or by extending through openings defined in the upper end of the shaft. No control circuit is included in the casing, the distance between the blades and the bottom wall can be substantially reduced and the structure is simplified.

6 Claims, 3 Drawing Sheets

HEAT DISSIPATION FAN

FIELD OF THE INVENTION

The present invention relates generally to a heat dissipation fan, and in particular to a heat dissipation fan having a simple structure and replaceable parts for reducing costs thereof.

BACKGROUND OF THE INVENTION

Heat dissipation fans are commonly employed to enhance removal of heat generated in computers in order to maintain proper operation of the computers. A side-mount heat dissipation fan comprises a casing having an open top for intake of surrounding air and a side opening in communication with a heat sink to conduct air flow toward and through the heat sink. The casing has a bottom that is closed for supporting a blade assembly comprised of a number of spaced blades for generating air flow during rotation. The blade assembly comprises a central hub or cylinder from which the blades radially and outwardly extend. The central cylinder defines an interior space in which windings for receiving alternate current to induce magnetic field that interacts with magnet to drive the blade assembly are formed.

Conventionally, wires that supply the alternate current to the windings are arranged on the bottom of the casing. Such an arrangement complicates the structure of the fan for a shaft of the blade assembly must be integrated with the bottom of the casing in order to allow the wires to extend therethrough into the blade assembly. The blade assembly is thus not separate from the casing. This means the blade assembly cannot be replaced by a new one if it is damaged or broken or otherwise malfunctioning. Costs of manufacturing and maintenance are thus increased.

The conventional heat dissipation fan comprises a control circuit embodied as a printed circuit board that is mounted to the bottom of the casing for controlling the operation of the blade assembly. This inevitably increases the distance between the bottom of the casing and the fan blades. The increased distance is likely to induce turbulence on the back side of the blades and such turbulence interferes with the air flow generated by the blades. The operation efficiency of the fan is thus reduced.

The present invention is thus aimed to overcome the problems encountered in the conventional heat dissipation fan having electrical wires leading into the fan from a bottom side of the fan.

SUMMARY OF THE INVENTION

An object of the present invention is to provide a heat dissipation fan wherein electrical wires that supply alternate current to the fan are arranged on top side of the fan for simplifying the structure of the fan.

Another object of the present invention is to provide a heat dissipation fan wherein replacement of a blade assembly is made possible by removably mounting a shaft of the blade assembly in the casing.

A further object of the present invention is to provide a heat dissipation fan wherein a gap between fan blades and a casing is effectively reduced by arranging electrical wires that supply alternate current into the fan from the top side of the fan.

Yet a further object of the present invention is to provide a low cost heat dissipation fan.

To achieve the above objects, in accordance with the present invention, there is provided a heat dissipation fan having a side mount configuration comprising a casing having a bottom wall and a surrounding side wall extending from the bottom wall to define an open top. The side wall also defines a side opening to guide an air flow toward a heat source. A cross bar is detachably mounted to the open top or is made of resilient material. A shaft is arranged inside the casing and has upper and lower ends removably received in a recess defined in the cross bar and a notch defined in the bottom wall of the casing. A blade assembly comprised of a cylinder and blades extending from the cylinder is rotatably mounted to the shaft. Windings and magnets are arranged inside the cylinder. Electrical wires are electrically connected to the windings via conductive pads formed on the upper end of the shaft or by extending through openings defined in the upper end of the shaft. No control circuit is included in the casing, the distance between the blades and the bottom wall can be substantially reduced and the structure is simplified.

BRIEF DESCRIPTION OF THE DRAWINGS

The present invention will be apparent to those skilled in the art by reading the following description of a preferred embodiment of the present invention, with reference to the attached drawings, in which.

DETAILED DESCRIPTION OF THE INVENTION

Figure 1:
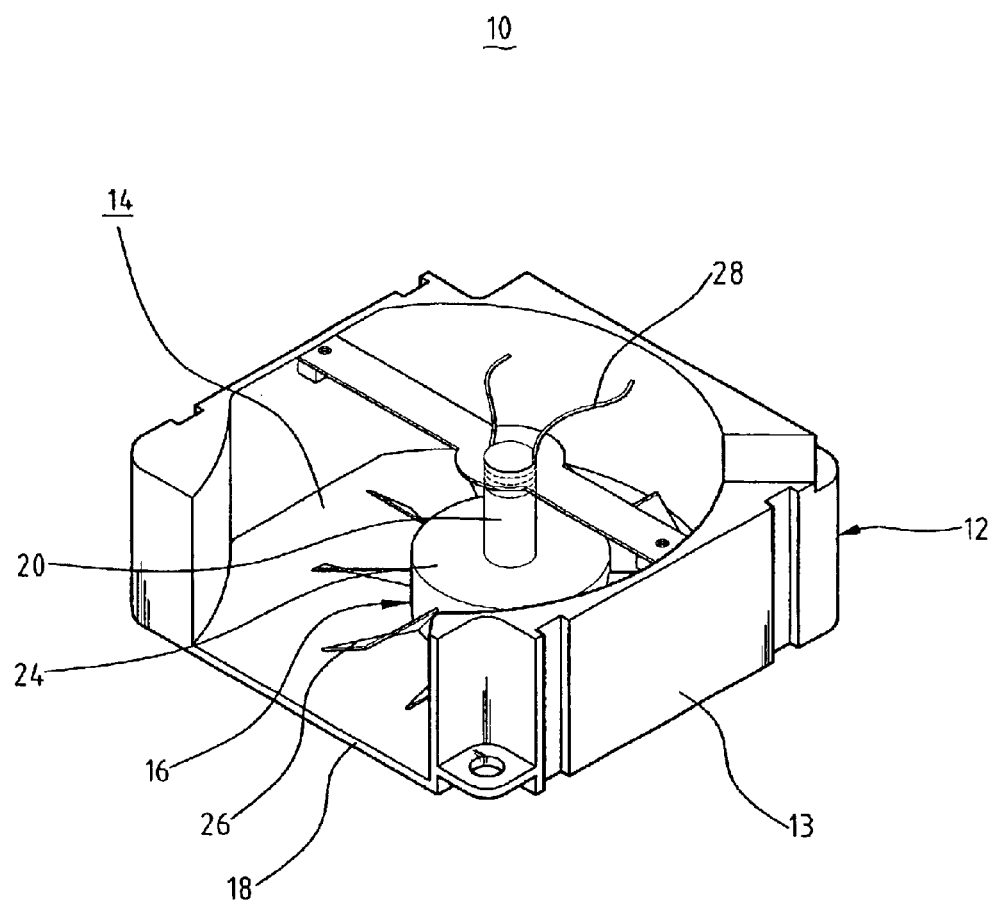
FIG. 1 is a perspective view of a heat dissipation fan constructed in accordance with the present invention.
Figure 2:
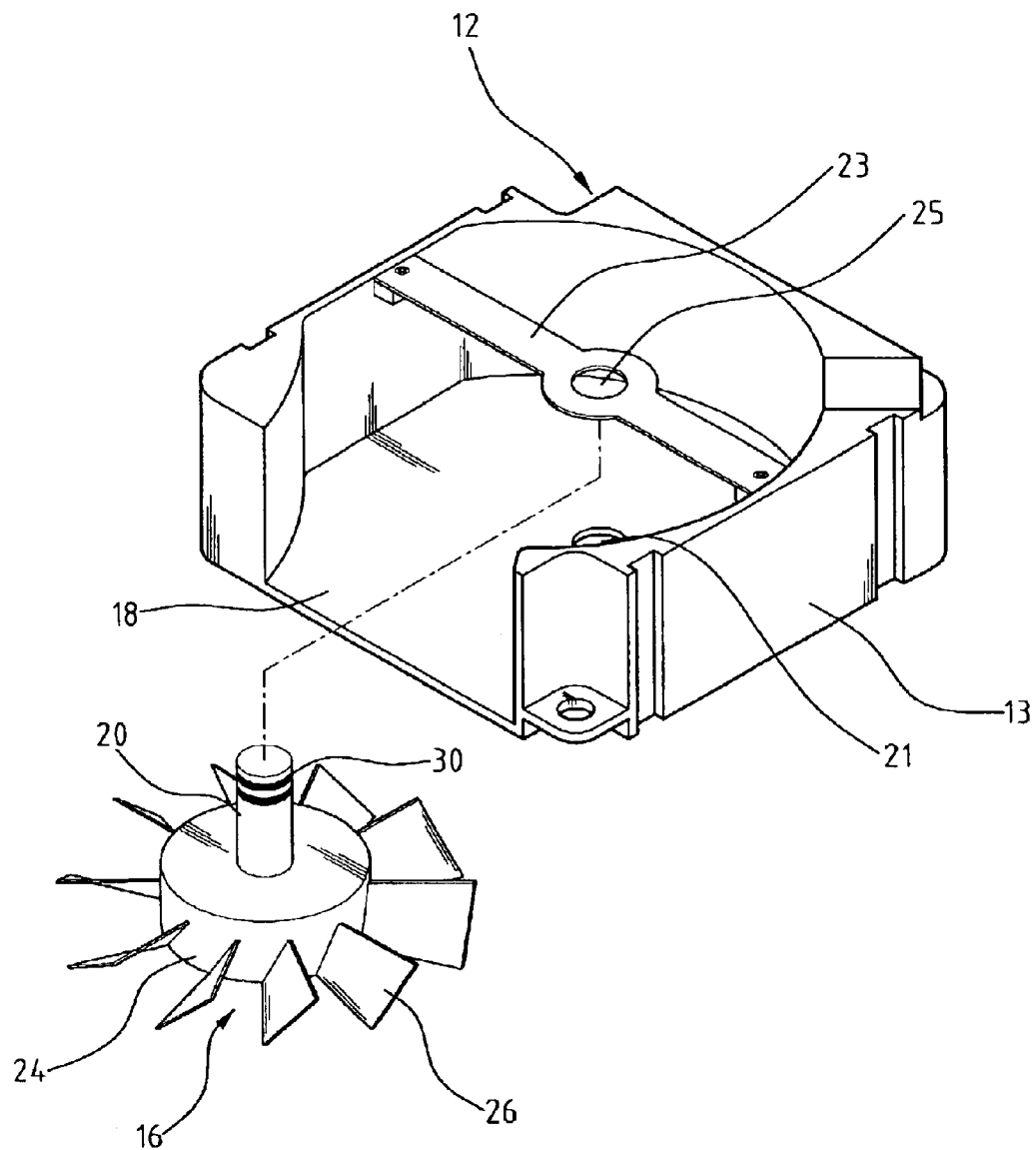
FIG. 2 is an exploded view of the heat dissipation fan of the present invention.
Figure 3:
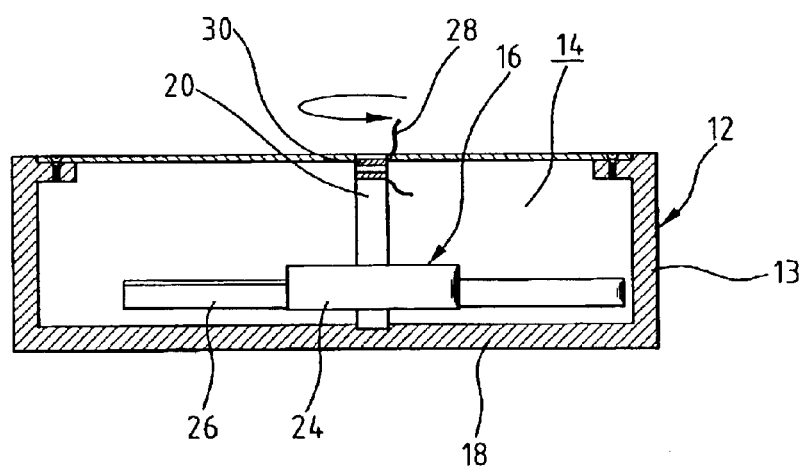
FIG. 3 is a cross-sectional view of the heat dissipation fan of the present invention.

With reference to the drawings and in particular to FIGS. 1 and 3, a heat dissipation fan constructed in accordance with the present invention, generally designated with reference numeral 10, comprises a casing 12 made of a rigid material, such as metal and hard plastics. In the embodiment illustrated, the fan 10 has a side mount configuration comprising a surrounding side wall 13 defining a cavity 14 in which a blade assembly 16 is received. The casing 12 has a bottom wall 18 on which the fan assembly 16 is rotatably supported. The side wall 13 extends from the bottom wall 18 and defines an open top of the casing 12. A shaft 20 for supporting rotation of the blade assembly 16 (as indicated by arrow of FIG. 3) extends through the blade assembly 16 and has a lower end removably received in a notch 21 defined in the bottom wall 18 and an upper end supported by a cross bar 23 mounted to the open top of the casing 12. Preferably, the cross bar 23 defines a recess 25 (best shown in FIG. 2) in which the upper end of the shaft 20 removably received. The side wall 13 forms a side opening through which an air flow induced by the rotation of the blade assembly 16 is guided toward a heat source (not shown).

The blade assembly 16 comprises a cylinder 24 and blades 26 extending radially from the cylinder 24. Windings and magnets (both not shown) are arranged inside the cylinder 24. The windings are connected to electrical wires 28 that extend from a control circuit (not shown) located outside the fan 10 for receiving alternate current from the control circuit for driving the blade assembly 16 inside the casing 12. Conductive pads 30 (best shown in FIG. 2) that are to engage the electrical wires 28 are formed on the upper end of the shaft 20 and are electrically connected to the windings through conductive members (not shown) arranged inside the shaft 20. In this respect, the shaft 20 is partially hollow. Alternatively, the shaft 20 forms openings in the upper end thereof through which the electrical wires extend to directly supply the alternate current to the windings.

The cross bar 23 can be made detachable from the casing 12 for the removal of the blade assembly 16 out of the casing 12. Alternatively, the cross bar 23 is made of a resilient material to allow the shaft 20, as well as the blade assembly 16 mounted thereon, to be removed out of the casing 12 for replacement.

Since no electronic parts or control circuit is included inside the casing 12, the distance between the blades 26 and the bottom 18 of the casing 14 can be substantially reduced and the structure of the fan is simplified.

Although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A heat dissipation fan comprising:

a casing having a bottom wall defining a notch and an open top;

a cross bar mounted to the open top and defining a recess;

a shaft having a lower end removably received in the notch and an upper end removably received in the recess, the shaft being partially hollow, ports being formed in the upper end of the shaft adapted to receive alternate current from electrical wires;

a rotary blade assembly rotatably supported by the shaft inside the casing and adapted to be powered by the electrical wires.

2. The heat dissipation fan as claimed in claim 1, wherein the ports comprise openings through which the electrical wires extend to supply the alternate current directly to the blade assembly.

3. The heat dissipation fan as claimed in claim 1, wherein the ports comprise conductive pads electrically connected to the blade assembly, the pads being engageable with the electrical wires.

4. The heat dissipation fan as claimed in claim 1, wherein the cross bar is detachably mounted to the casing.

5. The heat dissipation fan as claimed in claim 1, wherein the cross bar is resilient for removing the shaft out of the casing.

6. The heat dissipation fan as claimed in claim 1, wherein the fan has a side-mount configuration comprising a side wall surrounding the blade assembly and defining a side opening to guide an air flow caused by the blade assembly.

* * * * *

UNITED STATES PATENT AND TRADEMARK OFFICE
CERTIFICATE OF CORRECTION

PATENT NO. : 6,805,536 B2
DATED : October 19, 2004
INVENTOR(S) : Tsung-Yung Hung It is certified that error appears in the above-identified patent and that said Letters Patent is hereby corrected as shown below:

Title page,
Item [73], Assignee, change "Foothill Ranch, GA" to -- Foothill Ranch, CA --.

Signed and Sealed this

First Day of March, 2005

JON W. DUDAS
*Director of the United States Patent and Trademark Office*